(12) United States Patent
Chou et al.

(10) Patent No.: US 12,148,627 B2
(45) Date of Patent: Nov. 19, 2024

(54) METHOD FOR FORMING SEMICONDUCTOR MEMORY STRUCTURE

(71) Applicant: Winbond Electronics Corp., Taichung (TW)

(72) Inventors: Hsin-Hung Chou, Taichung (TW); Tsung-Wei Lin, Taichung (TW); Kao-Tsair Tsai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 594 days.

(21) Appl. No.: 17/480,757

(22) Filed: Sep. 21, 2021

(65) Prior Publication Data

US 2022/0108894 A1   Apr. 7, 2022

(30) Foreign Application Priority Data

Oct. 6, 2020 (TW) ................. 109134581

(51) Int. Cl.
| | |
|---|---|
| H01L 21/3213 | (2006.01) |
| H01L 21/027 | (2006.01) |
| H01L 21/311 | (2006.01) |
| H01L 29/66 | (2006.01) |
| H10B 41/30 | (2023.01) |

(52) U.S. Cl.
CPC .... *H01L 21/32139* (2013.01); *H01L 21/0274* (2013.01); *H01L 21/31138* (2013.01); *H10B 41/30* (2023.02); *H01L 29/6656* (2013.01)

(58) Field of Classification Search
CPC .......... H01L 21/32139; H01L 21/0274; H01L 21/31138; H01L 29/6656; H01L 21/0337; H10B 41/30
USPC ....................................................... 438/296
See application file for complete search history.

(56) References Cited

U.S. PATENT DOCUMENTS

| | | | |
|---|---|---|---|
| 9,245,766 B2 | 1/2016 | Wan | |
| 9,748,251 B1 | 8/2017 | Ogino | |
| 10,014,184 B2 | 7/2018 | Bencher | |
| 2013/0260557 A1* | 10/2013 | Wang | ................ H01L 21/32139 |
| | | | 438/669 |
| 2016/0233104 A1 | 8/2016 | Kim | |

FOREIGN PATENT DOCUMENTS

TW           I531032 B       4/2016

* cited by examiner

*Primary Examiner* — Caleen O Sullivan
(74) *Attorney, Agent, or Firm* — MUNCY, GEISSLER, OLDS & LOWE, P.C.

(57) ABSTRACT

A method for forming a semiconductor memory structure includes sequentially forming an active layer, a hard mask layer and a core layer over a substrate, and etching the core layer to form a core pattern. The core pattern includes a first strip, a second strip, and a plurality of supporting features abutting the first and second strips. The method also includes forming a spacer layer alongside the core pattern, removing the core pattern, forming a photoresist pattern above the spacer layer, etching the hard mask layer using the photoresist pattern and the spacer layer to form a hard mask pattern, and transferring the hard mask pattern into the active layer to form a gate stack.

19 Claims, 14 Drawing Sheets

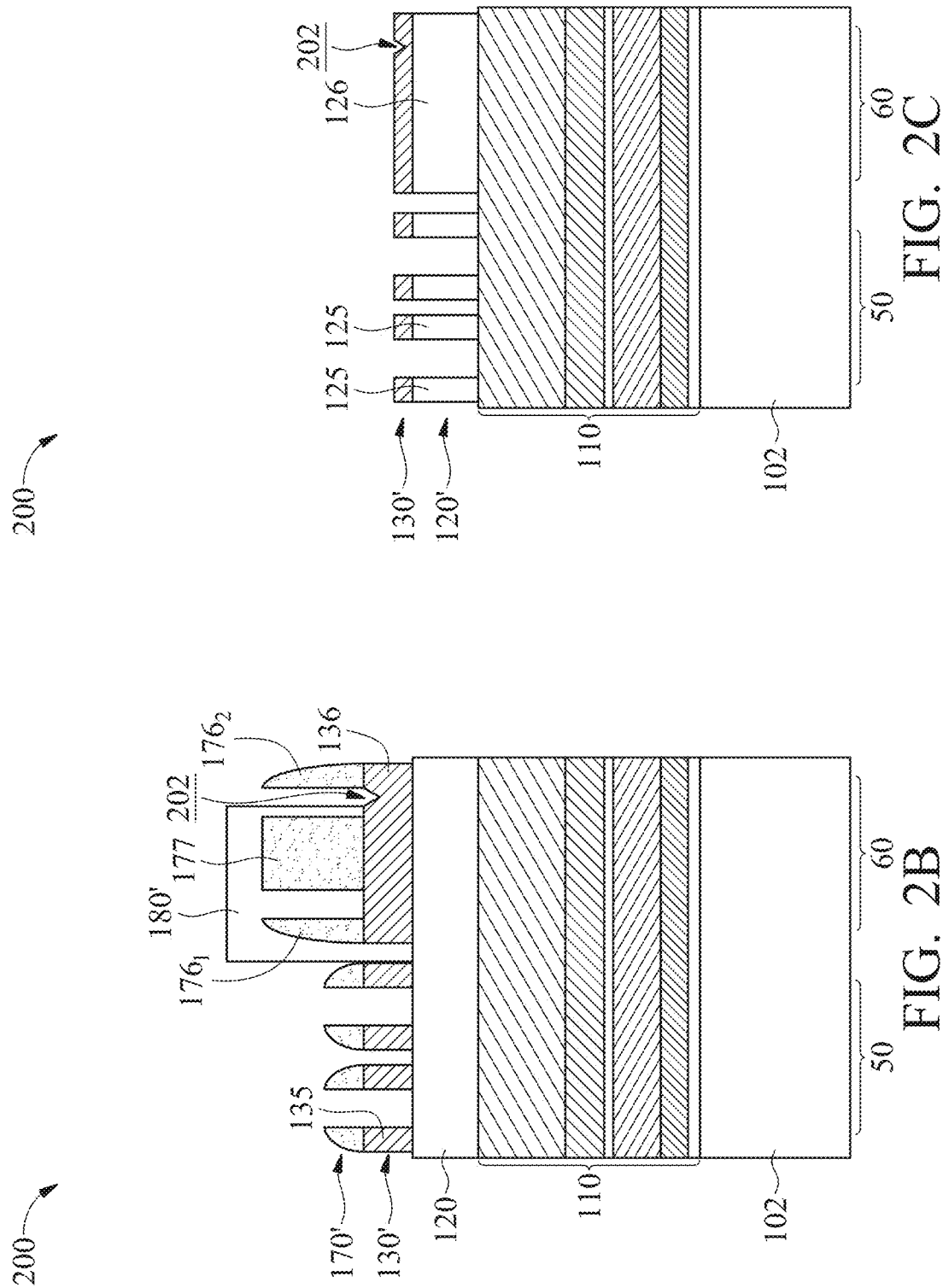

METHOD FOR FORMING SEMICONDUCTOR MEMORY STRUCTURE

CROSS REFERENCE TO RELATED APPLICATIONS

This application claims the benefit of Taiwan Patent Application No. 109134581 filed on Oct. 6, 2020, entitled "METHOD FOR FORMING SEMICONDUCTOR MEMORY STRUCTURE" which is hereby incorporated herein by reference.

BACKGROUND

Field of the Disclosure

The present disclosure relates to a method for forming a semiconductor memory structure, and in particular, it relates to a method for forming a flash memory.

Description of the Related Art

In order to increase element density in a flash memory device and improve its overall performance, existing technologies for fabricating flash memory devices continue to focus on scaling down the size of the elements. However, in scaling down the minimum size of the features (e.g., contacts), new challenges arise. Therefore, there is a need in the industry to improve the method of fabricating flash memory devices to overcome problems caused by scaling down the size of the elements.

SUMMARY

In some embodiments of the disclosure, a method for forming a semiconductor memory structure is provided. The method includes sequentially forming an active layer, a hard mask layer and a core layer over a substrate, and etching the core layer to form a core pattern. The core pattern includes a first strip, a second strip, and a plurality of supporting features abutting the first and second strips. The method also includes forming a spacer layer alongside the core pattern, removing the core pattern, forming a photoresist pattern above the spacer layer, etching the hard mask layer using the photoresist pattern and the spacer layer to form a hard mask pattern, and transferring the hard mask pattern into the active layer to form a gate stack. Forming the spacer layer includes forming a conform layer along the core pattern and filling a plurality of openings which are defined by the first strip, the second strip and the plurality of supporting features, and etching the conform layer.

In some embodiments of the disclosure, a method for forming a semiconductor memory structure is provided. The method includes sequentially forming an active layer, a hard mask layer and a core layer over a substrate, and forming a first photoresist pattern and a second photoresist pattern over the core layer. The second photoresist pattern includes a first strip, a second strip, and a plurality of connecting features extending from the first strip to the second strip. The method also includes transferring the first photoresist pattern and the second photoresist into the core pattern to form a first core pattern and a second core pattern respectively. The second core pattern includes a third strip, a fourth strip, and a plurality of supporting features extending from the third strip to the fourth strip. The method also includes forming a pair of first spacers on opposite sides of the first core pattern and a pair of second spacers on opposite sides of the second core pattern, removing the first core pattern and the second core pattern, forming a third photoresist pattern over the pair of second spacers, and etching the hard mask layer and the active layer using the third photoresist pattern, the pair of first spacers, and the pair of second spacers. Forming the pair of first spacers and the pair of second spacers comprises forming a conformal layer along the first and second core patterns to fill a plurality of openings which are defined by the third strip, the fourth trop and the plurality of supporting features.

BRIEF DESCRIPTION OF THE DRAWINGS

The present disclosure can be further understood by reading the subsequent detailed description and examples with references made to the accompanying drawings, wherein:

FIGS. 1A through 1I, FIGS. 2A through 2C, FIGS. 3A and 3B illustrate cross-sectional views of forming a semiconductor memory structure at various stages in accordance with some embodiments of the present disclosure.

FIGS. 1A-1 through 1I-1 illustrate plan views of the semiconductor memory structures of FIGS. 1A-1I.

FIG. 2A-1 illustrates a plan view of the semiconductor memory structure of FIG. 2A.

FIG. 3B-1 illustrates a plan view of the semiconductor memory structure of FIG. 3B.

FIGS. 4A-1 through 4C-1 illustrate plan views of forming a semiconductor memory structure at various stages in accordance with some embodiments of the present disclosure.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure.

Figure 1A:
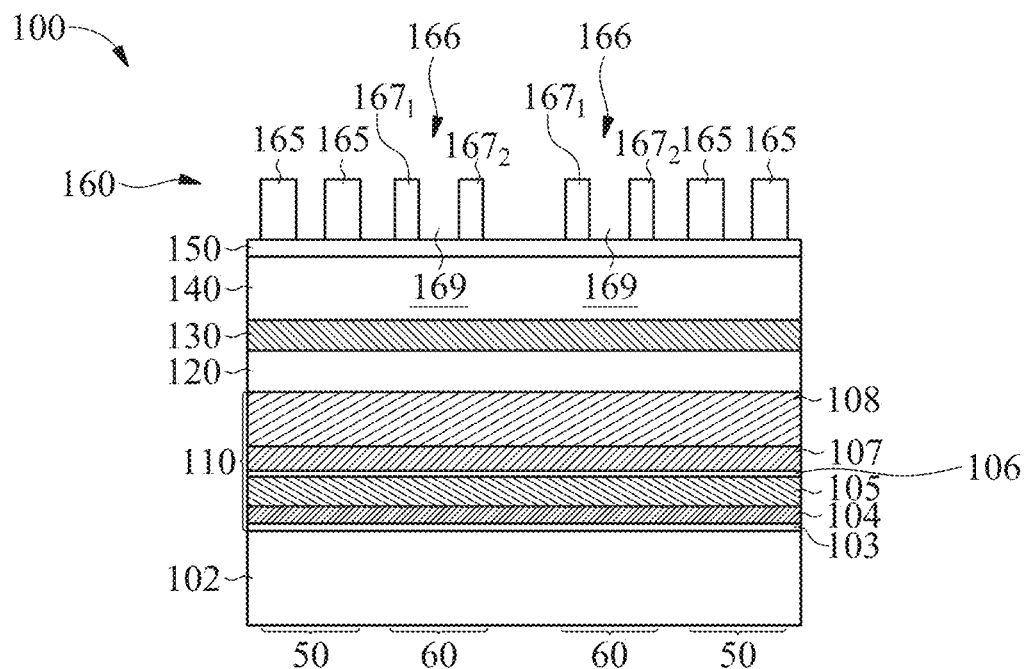
Figures 1, 1A:
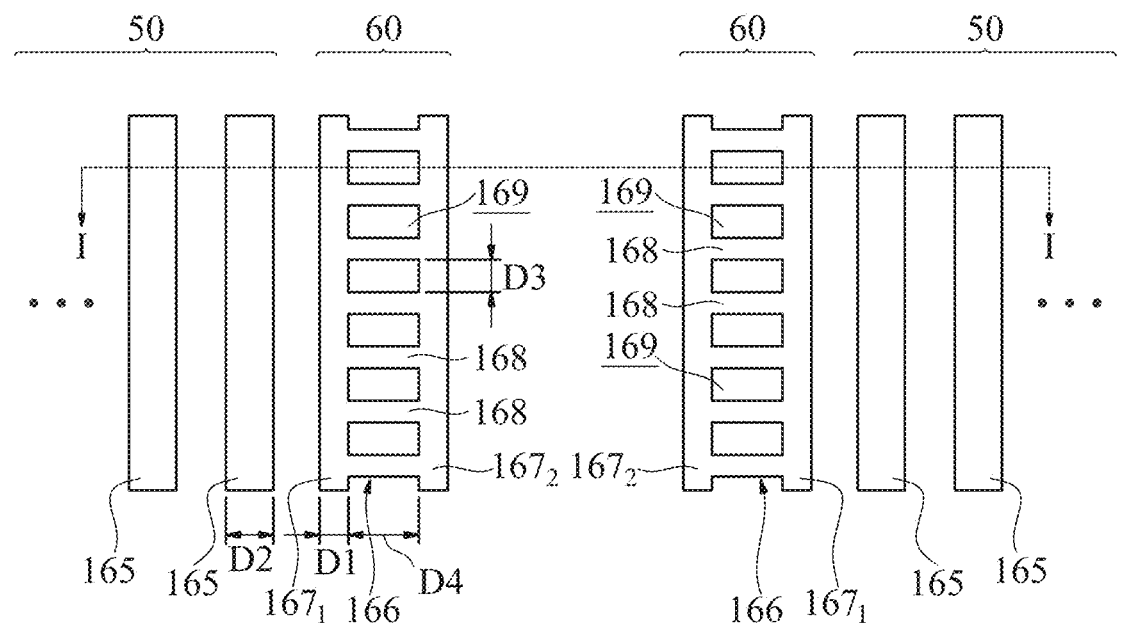
Figure 1B:
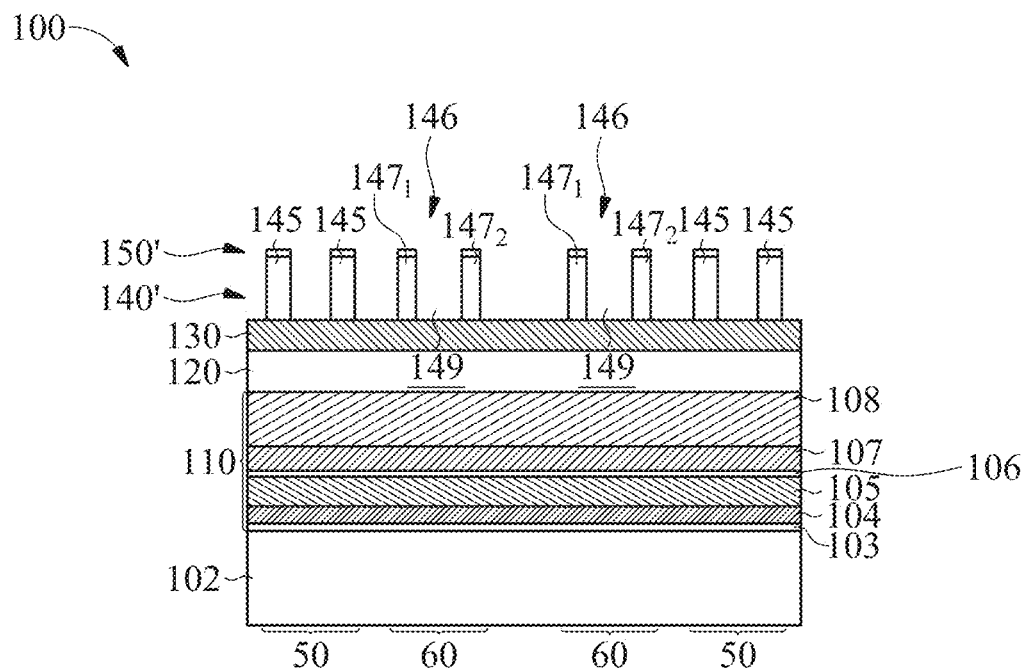
Figures 1, 1B:
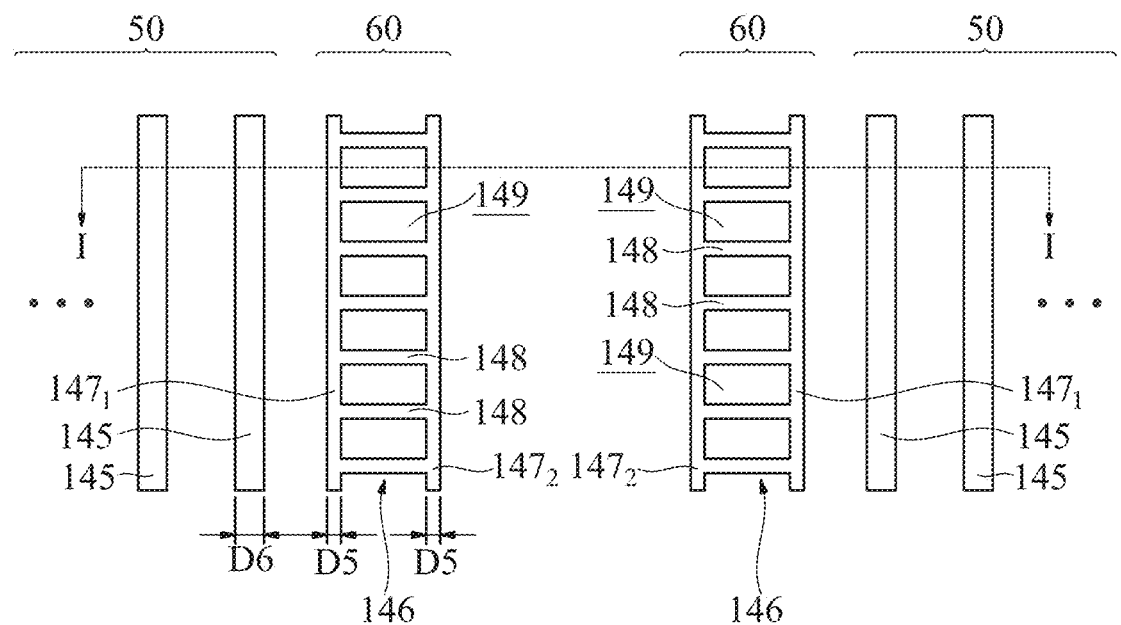
Figure 1C:
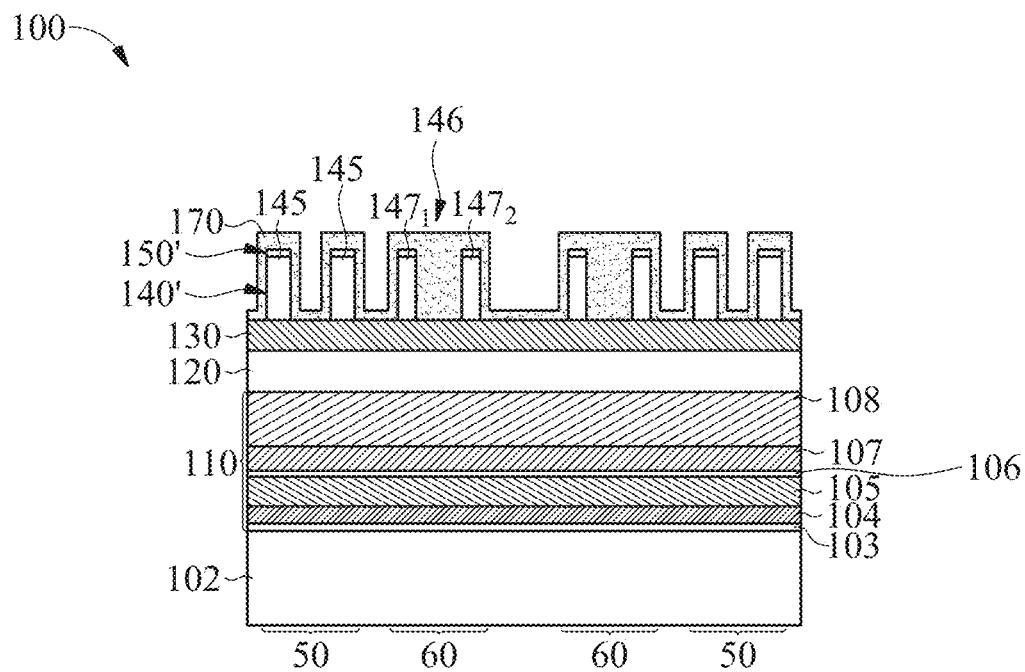
Figures 1, 1C:
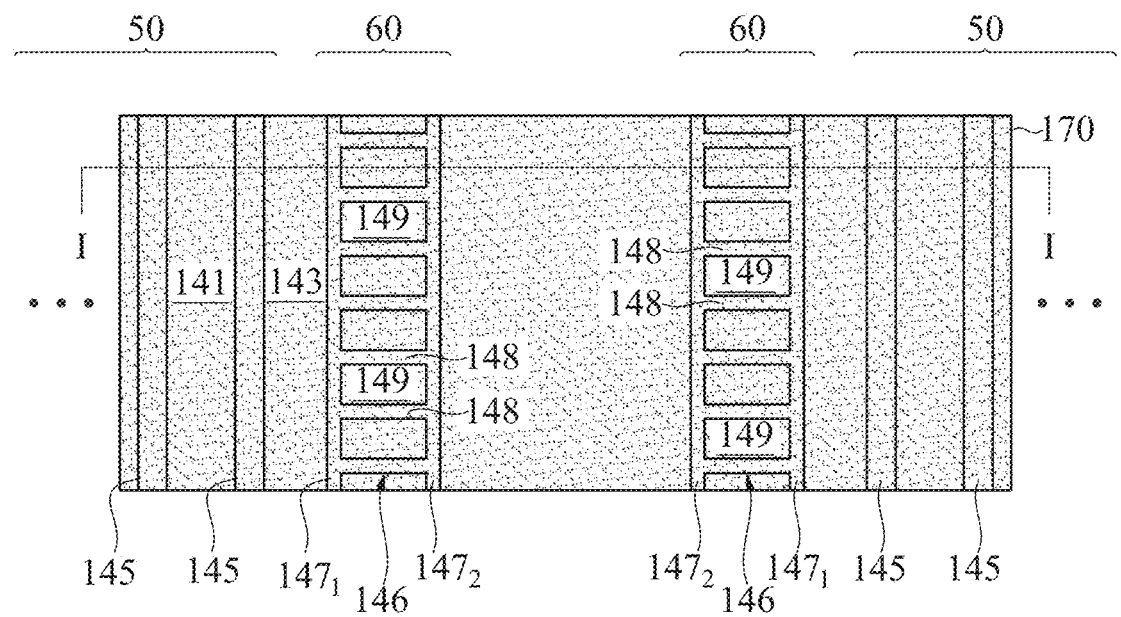
Figure 1D:
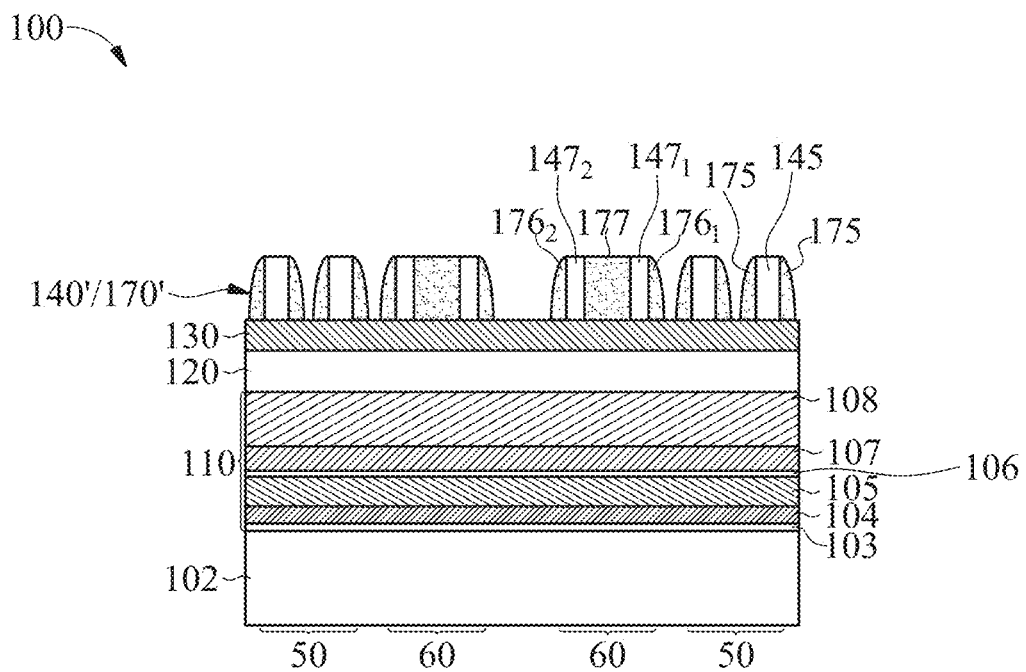
Figures 1, 1D:
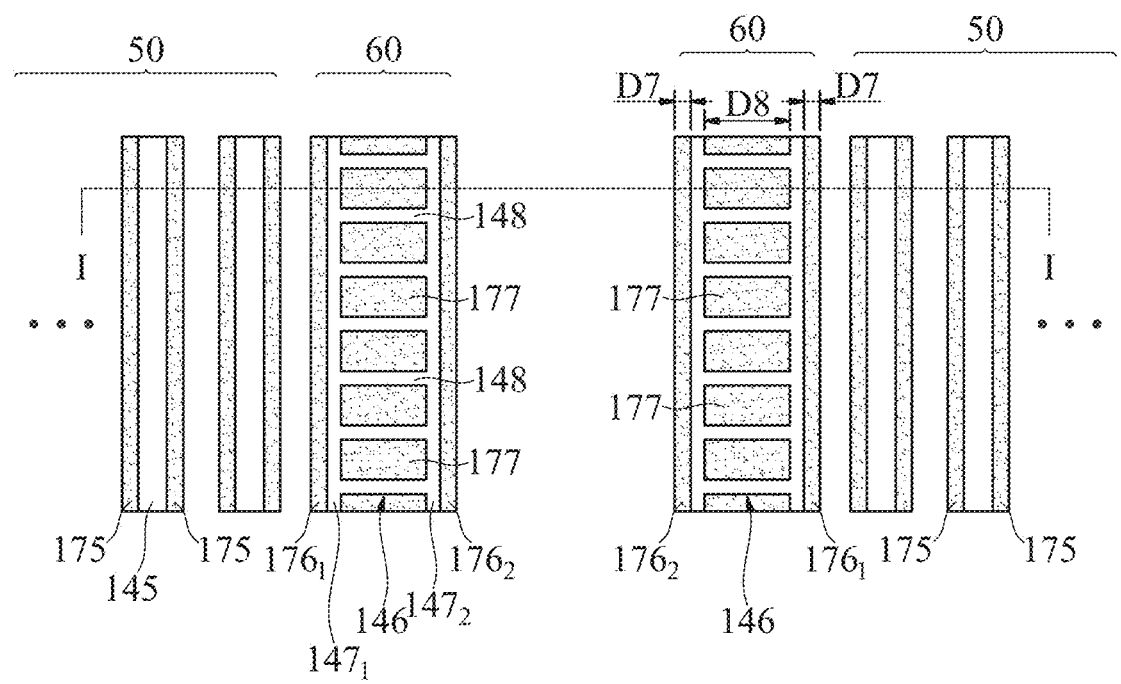
Figure 1E:
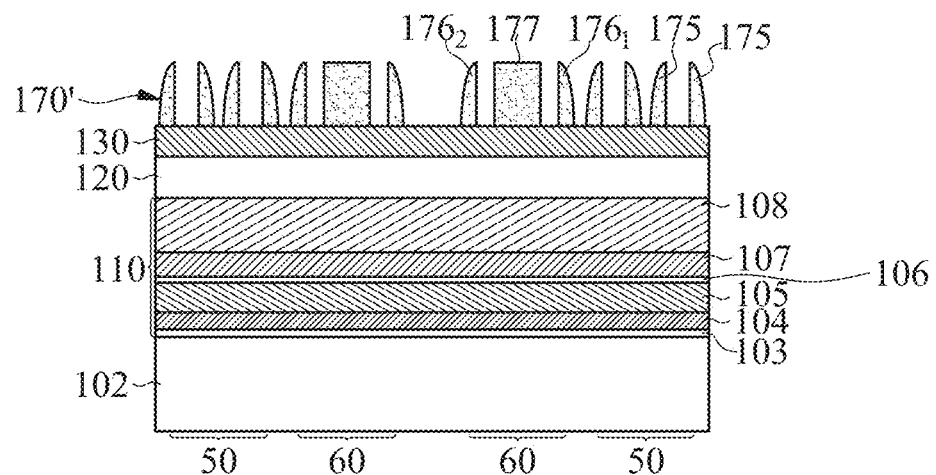
Figures 1, 1E:
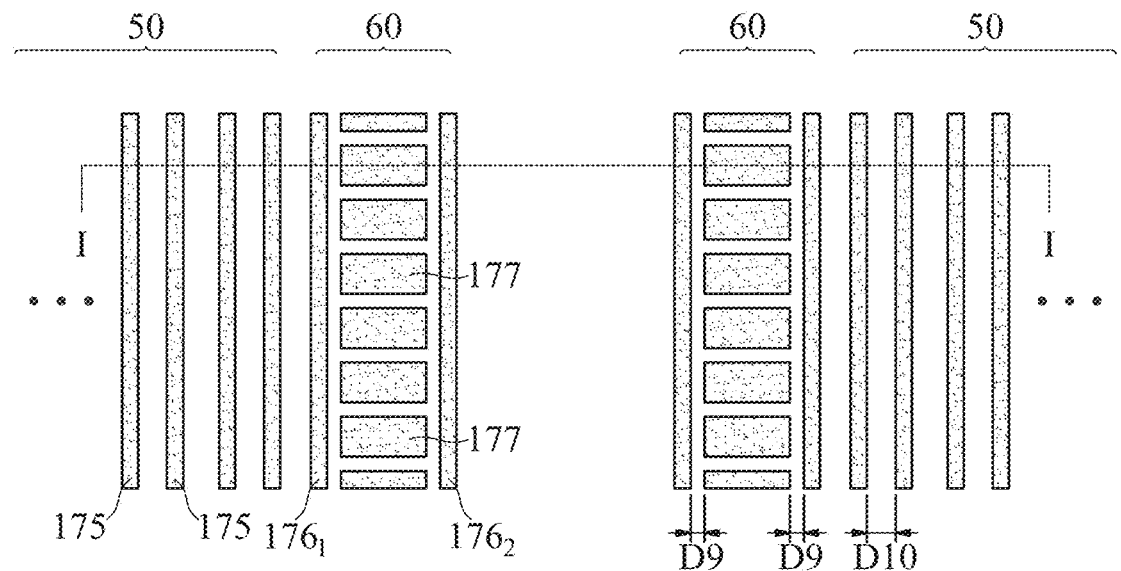
Figure 1F:
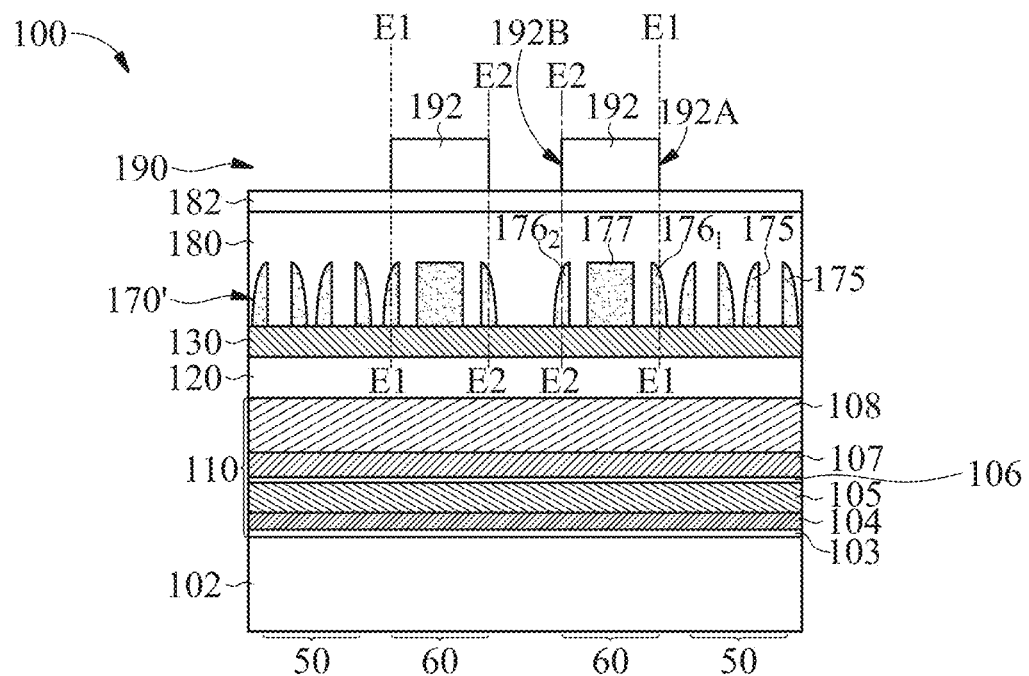
Figures 1, 1F:
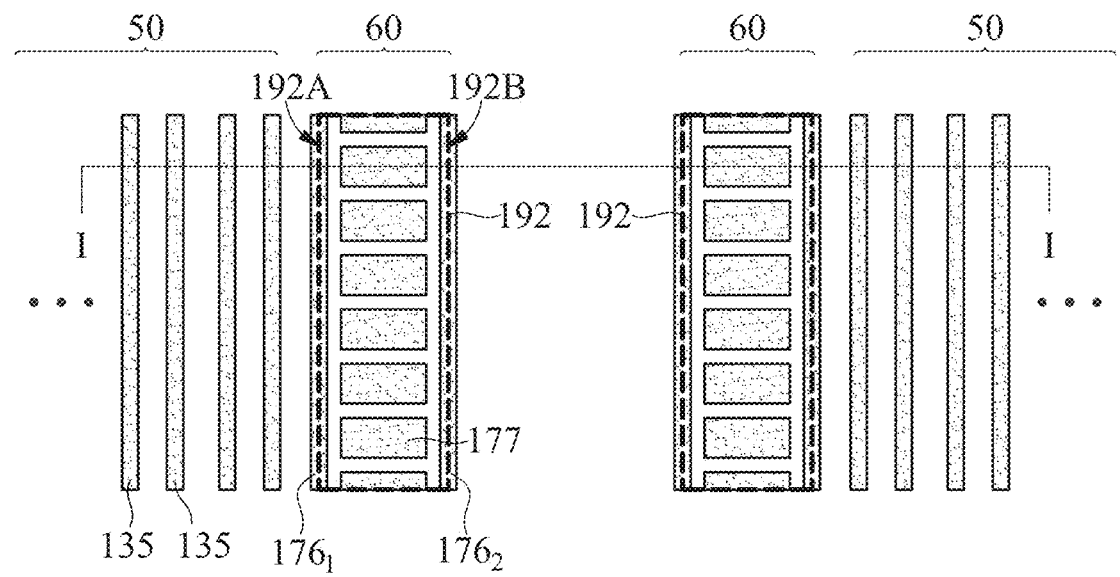
Figure 1G:
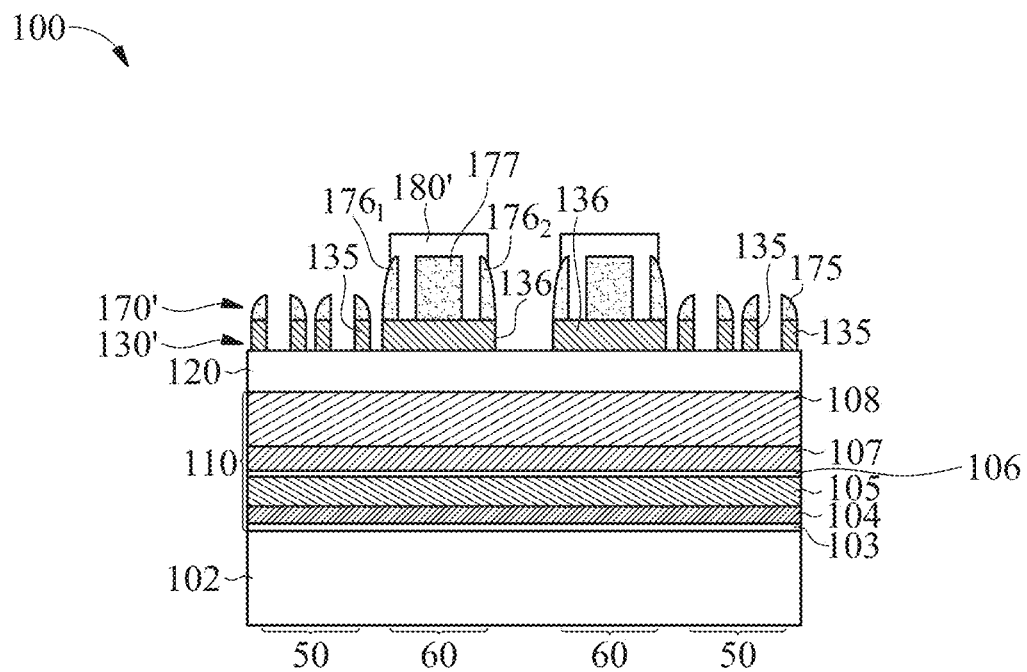
Figures 1, 1G:
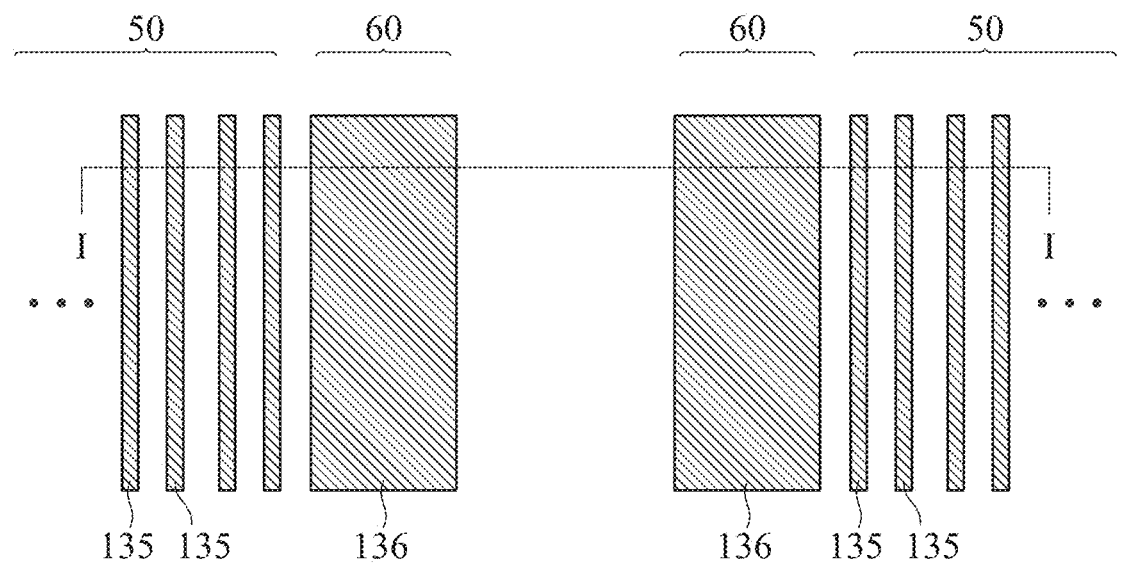
Figure 1H:
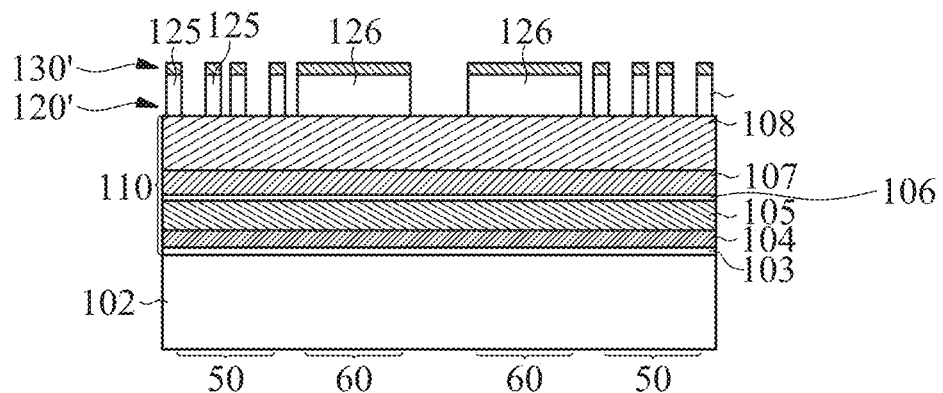
Figures 1, 1H:
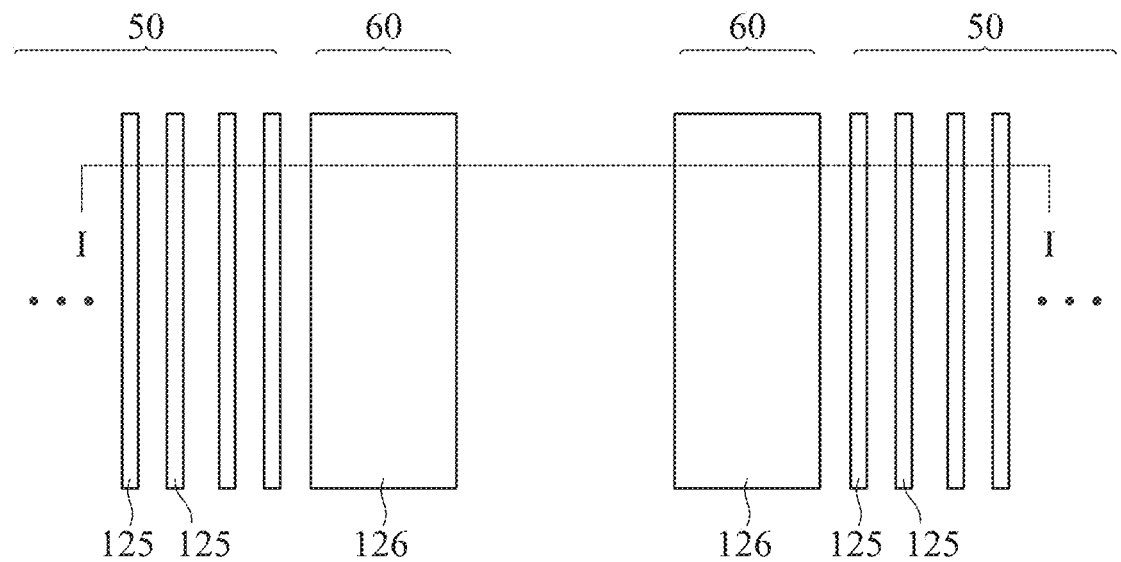
Figure 1I:
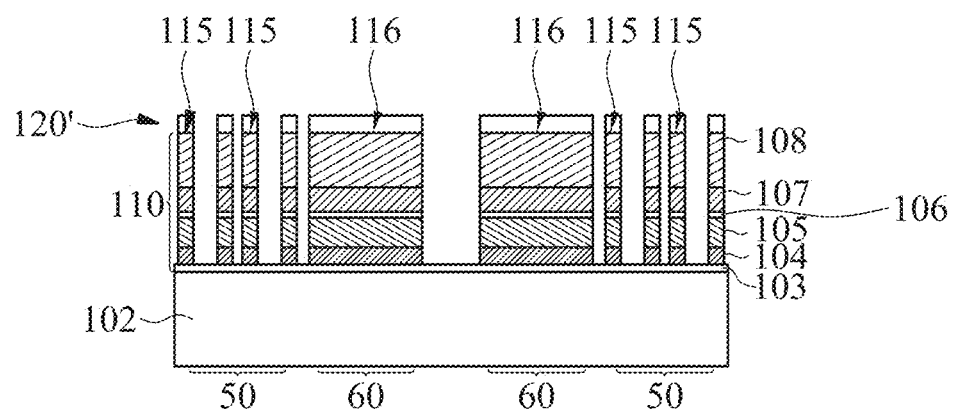
Figures 1, 1I:
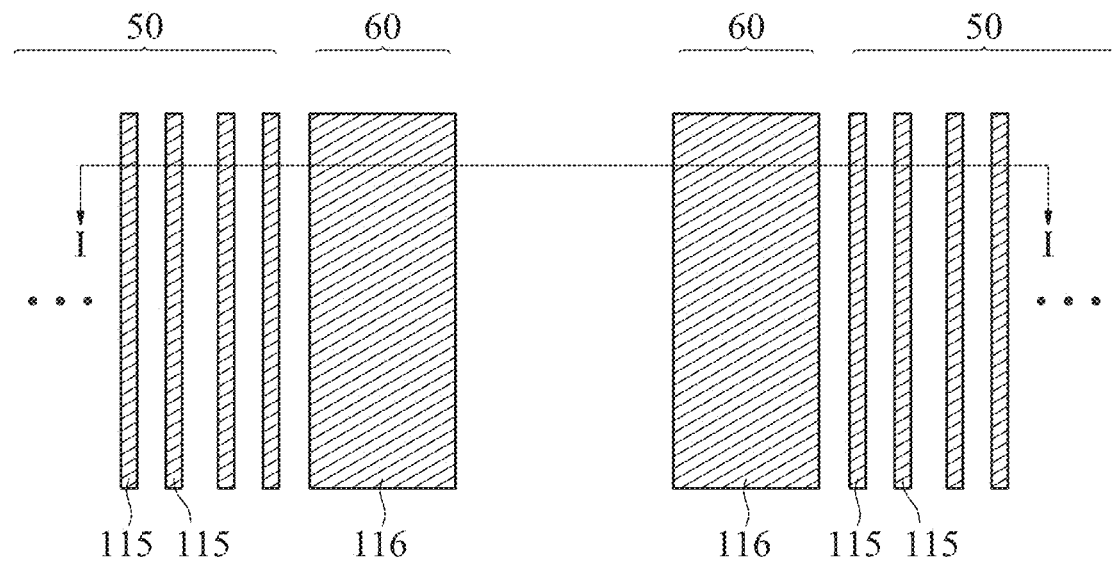

FIGS. 1A through 1I and FIGS. 1A-1 through 1I-1 illustrate schematic views of forming a semiconductor memory structure at various stages in that FIGS. 1A through 1I are cross-sectional views taken along lines I-I shown in plan views of FIGS. 1A-1 through 1I-1, respectively, in accordance with some embodiments of the present disclosure.

FIG. 1A illustrates a cross-sectional view of a semiconductor memory structure 100 which includes a memory cell predetermined area 50 and a select transistor predetermined area 60 adjacent to the memory cell predetermined area 50. Memory cells and their word lines are to be formed in the memory cell predetermined area 50, and select transistors (e.g., bit line select transistors or source line select transistors) are to be formed in the select transistor predetermined area 60. Although FIG. 1A shows one memory cell predetermined area 50 and one select transistor predetermined area 60 adjacent thereto, one memory cell predetermined area 50 may be disposed between two select transistor predetermined areas 60. In some embodiments, a portion of the select transistor predetermined area 60 close to the memory cell predetermined area 50 is a pattern-dense region, and a portion of the select transistor predetermined area 60 away from the memory cell predetermined area 50 is a pattern-sparse region.

The formation of the semiconductor memory structure 100 includes providing a semiconductor substrate 102. In some embodiments, the semiconductor substrate 102 may be an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

An active layer 110 is formed over the semiconductor substrate 102. The active layer 110 is a multilayered stack which includes a tunneling oxide layer 103, a first polysilicon layer 104, a second polysilicon layer 105, a gate dielectric layer 106, a third polysilicon layer 107 and a fourth polysilicon layer 108 sequentially formed over the semiconductor substrate 102, in accordance with some embodiments. The tunneling oxide layer 103 is made of silicon oxide. The first polysilicon layer 104 and the second polysilicon layer 105 may be doped and used to form floating gates of memory cells. The gate dielectric layer 106 may be a tri-layer structure including oxide-nitride-oxide (ONO). The third polysilicon layer 107 and the fourth polysilicon layer 108 may be doped and used to form control gates of memory cells and also be served as word lines.

A dielectric hard mask layer 120 is formed over the active layer 100. In some embodiments, the dielectric hard mask layer 120 is made of dielectric material such as silicon oxide (SiO), silicon oxynitride (SiON), silicon nitride (SiN), and/or another suitable a dielectric material. In an embodiment, the dielectric hard mask layer 120 is made of TEOS (tetraethyl orthosilicate) oxide.

A semiconductor hard mask layer 130 is formed over the dielectric hard mask layer 120. In some embodiments, the semiconductor hard mask layer 130 is made of a semiconductor material such as polysilicon.

A core layer 140 is formed over the semiconductor hard mask layer 130. In some embodiments, the core layer 140 is made of a carbon-rich material such as carbon or spin-on coating (SOC) carbon.

An anti-reflective layer 150 is formed over the core layer 140. In some embodiments, the anti-reflective layer 150 is made of a silicon-rich material such as silicon oxynitride (SiON).

A patterned photoresist layer 160 is formed over the anti-reflective layer 150 using a photolithography process, as shown in FIGS. 1A and 1A-1. The patterned photoresist layer 160 includes a plurality of first photoresist patterns 165 disposed in the memory cell predetermined area 50 and a second photoresist pattern 166 disposed in the select transistor predetermined area 60.

The first photoresist patterns 165 are strips which are arranged in parallel in a first direction A1 and extend in a second direction A2, as shown in FIG. 1A-1. The first direction A1 and the second direction A2 are horizontal directions. The first direction A1 is substantially perpendicular to the second direction A2. The number of the first photoresist patterns 165 in the memory cell predetermined area 50 may be in a range from 6 to 10 such as 8.

The second photoresist pattern 166 has a rail-like profile. In specific, the second photoresist pattern 166 includes a strip $167_1$, a strip $167_2$ and a plurality of connecting features 168 between the strip $167_1$ and the strip $167_2$, as shown in FIG. 1A-1. The strip $167_1$ is closer to the memory cell predetermined area 50 than the strip $167_2$. The strip $167_1$ and the strip $167_2$ are arranged in parallel in the first direction A1 and extend in the second direction A2. The connecting features 168 are arranged in parallel in the second direction A2 and extend in the first direction A1. The connecting features 168 continuously extend from the strip $167_1$ to the strip $167_2$ to connect the strip $167_1$ and the strip $167_2$. The strip $167i$, the strip $167_2$ and the connecting features 168 define a plurality of openings 169 which exposes the anti-reflective layer 150. The number of the connecting features 168 may depend on the lengths of the strip $167_1$ and the strip $167_2$, for example, 5-1000.

In some embodiments, the strip $167_1$ and the strip $167_2$ of the second photoresist pattern 166 has a width of D1 in the first direction A1. The first photoresist pattern 165 has a width of D2 in the first direction A1. The ratio of width D1 to width D2 is about 0.8 to about 1.0. If the ratio of width D1 to width D2 is too low, the risk of collapse of a core pattern in the select transistor predetermined area 60 may increase. If the ratio of width D1 to width D2 is too high, it may be hard to enlarge the overlay window of a subsequent photolithography process for forming the select gate pattern.

In some embodiments, the opening 169 has a length of D3 in the second direction A2 (i.e., the distance between neighboring connecting features 168) and a width of D4 in the first direction A1 (i.e., the distance between the strip $167_1$ and the strip $167_2$). The ratio of length D3 to width D4 is about 1.0 to about 4.0.

An etching process is performed on the semiconductor memory structure 100 using the patterned photoresist layer 160 to sequentially remove portions of the anti-reflective layer 150 and the core layer 140 uncovered by the patterned photoresist layer 160 until the upper surface of the semiconductor hard mask layer 130 is exposed, as shown in FIGS. 1B and 1B-1. In some embodiments, the etching process is dry etching. The patterned photoresist layer 160 may be entirely consumed in the etching process, or alternatively removed by another ashing process.

After the etching process, the anti-reflective layer 150 and the core layer 140 are denoted as a patterned anti-reflective layer 150' and a patterned core layer 140'. The photoresist patterns 165 and 166 of the patterned photoresist layer 160 are transferred into the core layer 140 so that the core layer 140 forms first core patterns 145 corresponding to the first photoresist patterns 165 and a second core pattern 146 corresponding to the second photoresist pattern 166. After the etching process, a trimming process may be performed on the patterned core layer 140' thereby reducing the defects formed on the surface of the semiconductor memory structure 100, in accordance with some embodiments. The trimming process may be an etching process using $O_2$.

The first core patterns 145 are strips which are arranged in parallel in the first direction A1 and extend in the second direction A2. The second core pattern 146 includes a strip $147_1$, a strip $147_2$ and a plurality of supporting features 148 between the strip $147_1$ and the strip $147_2$. The strip $147_1$ is closer to the memory cell predetermined area 50 than the strip $147_2$. The strip $147_1$ and the strip $147_2$ are arranged in parallel in the first direction A1 and extend in the second direction A2. The supporting features 148 are arranged in parallel in the second direction A2 and extend in the first direction A1. The supporting features 148 abut the strip $147_1$ and the strip $147_2$ and continuously extend from the strip $147_1$ to the strip $147_2$. The strip $147_1$, the strip $147_2$ and the supporting features 148 define a plurality of openings 149 which exposes the semiconductor hard mask layer 130.

The supporting features 148 abutting the strip $147_1$ and the strip $147_2$ are configured to support the strip $147_1$ and the strip $147_2$, thereby preventing collapse of the strip $147_1$ and the strip $147_2$. Because the etching process makes larger etching amount in a pattern-sparse region, in the case without forming the supporting features 148 it is required to form the core pattern in the select transistor predetermined area to have a greater width than the width of the core pattern formed in the memory cell predetermined area. This prevents collapse of the core pattern in the select transistor predetermined area during or after the etching process such as the trimming process. As a result, the strip $147_1$ and the strip $147_2$ may be formed to have the same width as or a smaller width than the width of the first core pattern 145, which may enlarge the overlay window of a subsequent photolithography process for forming a select gate pattern.

In some embodiments, the strips $147_1$ and $147_2$ of the second core pattern 146 have a width of D5 in the first direction A1. The first core pattern 145 has a width of D6 in the first direction A1. The ratio of width D5 to width D6 is about 0.8 to about 1.0. If the ratio of width D5 to width D6 is too low, the risk of collapse of the core pattern 146 may increase. If the ratio of width D5 to width D6 is too high, it may be hard to enlarge the overlay window of a subsequent photolithography process for forming a select gate pattern. In addition, in some embodiments, due to the loading effect of the etching process, the width D5 of the strip $147_2$, which is in the pattern-sparse region, may be less than the width D5 of the strip $147_1$, which is in the pattern dense region.

A conformal layer 170 is formed along the upper surface of the semiconductor hard mask layer 130, the sidewalls of the patterned core layer 140' and the sidewalls and the upper surfaces of the patterned anti-reflective layer 150', as shown in FIGS. 1C and 1C-1. The conformal layer 170 overfills the openings 149. In some embodiments, the conformal layer 170 is made of a dielectric material such as silicon oxide (SiO), silicon oxynitride (SiON), silicon nitride (SiN), and/or another suitable dielectric material.

An etching process is performed on the semiconductor memory structure 100. The etching process removes portions of the conformal layer 170 along the upper surface of the semiconductor hard mask layer 130 and the upper surfaces of the patterned anti-reflective layer 150', thereby forming a spacer layer 170' alongside the patterned core layer 140', as shown in FIGS. 1D and 1D-1. In some embodiments, the etching process is dry etching. The patterned anti-reflective layer 150' may be entirely consumed in the etching process, or alternatively removed by an additional etching process.

The spacer layer 170' includes multiple pairs of first spacers 175 disposed on the opposite sides of the first core patterns 145, a pair of second spacers 176 disposed on the opposite sides of the second core patterns 146, and a plurality of third spacers 177 filling the openings 149. The second spacer along the strip $147_1$ is denoted as $176_1$ and the second spacer along the strip $147_2$ is denoted as $176_2$. Due to the characteristics of the etching process, the widths of the first spacers 175 and the second spacers 176 decrease upwardly, in accordance with some embodiments.

The first spacers 175 are arranged in parallel in the first direction A1 and extend in the second direction A2. The second spacers $176_1$ and $176_2$ are arranged in parallel in the first direction A1 and extend in the second direction A2. The third spacer 177 are separated from one another by the supporting portions 148 and arranged in the second direction A2.

In some embodiments, the first spacer 175 and the second spacers $176_1$ and $176_2$ have widths D7. The third spacer 177 has a width of D8. In some embodiments, the ratio of width D7 to width D8 is about 0.1 to about 1.0.

The patterned core layer 140' is removed until the semiconductor hard mask layer 130 is exposed, as shown in FIGS. 1E and 1E-1. In some embodiments, the etching process is dry etching. Because the strips $147_1/147_2$ are formed to have narrower widths, the distance D9 between the second spacer $176_1/176_2$ and the third spacer 177 (i.e., the width D5 of the strips $147_1/147_2$ of the second core pattern 146) is equal to or less than the distance D10 between the first spacers 175 (i.e., the width D6 of the first core pattern 145). This may enlarge the overlay window of a subsequent photolithography process for forming a select gate pattern. In some embodiments, the ratio of distance D9 to distance D10 is about 0.8 to about 1.0. If the ratio of distance D9 to distance D10 is too high, it may be hard to enlarge the overlay window of a subsequent photolithography process for forming a select gate pattern.

A fill layer 180, an anti-reflective layer 182 and a patterned photoresist layer 190 are sequentially formed over the semiconductor memory structure 100, as shown in FIGS. 1F and 1F-1. The fill layer 180 covers the spacer layer 170' and fills gaps formed by removing the patterned core layer 140'. In some embodiments, the fill layer 180 is made of a carbon-rich material such as carbon or spin-on coating (SOC) carbon. In some embodiments, the anti-reflective layer 182 is made of a silicon-rich material such as silicon oxynitride (SiON).

The patterned photoresist layer 190 includes a photoresist pattern 192 disposed in the select transistor predetermined area 60. The photoresist pattern 192 is disposed directly above and covers the second spacers $176_1$ and $176_2$ and the third spacers 177. In some embodiments, the extending line E1-E1 of a sidewall (edge) 192A of the photoresist pattern 192 in the pattern-dense region is aligned to (e.g., passes through) the second spacer $176_1$. That is, in a plan view of FIG. 1F-1, the sidewall 192A of the photoresist pattern 192 is located within the area of the second spacer $176_1$. In some embodiments, the extending line E2-E2 of another sidewall (edge) 192B of the photoresist pattern 192 in the pattern-sparse region is aligned to (e.g., passes through) the second spacer $176_2$. That is, in a plan view of FIG. 1F-1, the sidewall 192B of the photoresist pattern 192 is located within the area of the second spacer $176_2$.

The strip $147_1$ and strip $147_2$ of the second core pattern 146 can be formed to have the narrower widths D5 by forming the supporting features 148 (FIG. 1B-1) of the second core pattern 146, thereby reducing the distance D9 between the second spacer $176_1/176_2$ and the third spacer 177 (FIG. 1E-1). As such, it may allow the spacer layer 170' (including the second spacer $176_1/176_2$ and the third spacer 177) to have a higher coverage rate (or area percentage) within the select transistor predetermined area 60, which may reduce the likelihood of misalignment of the photoresist pattern 192 with the second spacer $176_1/176_2$. For example, the extending line E1-E1 (or E2-E2) of the sidewall 192A (or 192B) of the photoresist pattern 192 does not pass through the second spacer $176_1$ (or $176_2$). If the photoresist pattern 192 is misaligned with the second spacer $176_1/176_2$, the subsequently formed select gate may suffer a pattern failure issue.

Therefore, the embodiments of the present disclosure utilize the supporting features 148 of the second core pattern 146 to enlarge the overlay window of the photolithography process for forming patterned photoresist layer 190. The specification/control limit of the overlay of the photolithography process may be relaxed, which in turn saves the manufacturing cost and increases the production yield.

An etching process is performed on the semiconductor memory structure 100 using the patterned photoresist layer 190 and the spacer layer 170'. Portions of the anti-reflective layer 182, fill layer 180 and the semiconductor hard mask layer 130 uncovered by the patterned photoresist layer 190 and the spacer layer 170' are sequentially etched until the upper surface of the dielectric hard mask layer 120, as shown in FIGS. 1G and 1G-1. In some embodiments, the etching process is dry etching. After the etching process, the semiconductor hard mask layer 130 is denoted as a patterned semiconductor hard mask layer 130'. The patterns of the first spacers 175 are transferred into the semiconductor hard mask layer 130 to form hard mask patterns 135. The photoresist pattern 192 of the patterned photoresist layer 190 and the patterns of the second spacer layers $176_1/176_2$ are collectively transferred into the semiconductor hard mask layer 130 to form a hard mask pattern 136. The patterned photoresist layer 190 and the anti-reflective layer 182 may be also entirely consumed in the etching process, or alternatively removed by additional processes. A remainder of the fill layer 180 is denoted as a fill layer 180'. In addition, the first spacer 175, uncovered by the photoresist pattern 192, may be partially consumed in the etching process.

An etching process is performed on the semiconductor memory structure 100 using the patterned semiconductor hard mask layer 130'. Portions of the dielectric hard mask layer 120 uncovered by the patterned semiconductor hard mask layer 130 are etched until the upper surface of the active layer 110, as shown in FIGS. 1H and 1H-1. In some embodiments, the etching process is dry etching. After the etching process, the dielectric hard mask layer 120 is denoted as a patterned dielectric hard mask layer 120'. The hard mask patterns 135 and 136 of the patterned semiconductor hard mask layer 130' are transferred into the dielectric hard mask layer 120 so that the dielectric hard mask layer 120 forms hard mask patterns 125 and 126, respectively. The fill layer 180' and the spacer layer 170' may be also removed in the etching process, or alternatively by additional processes.

An etching process is performed on the semiconductor memory structure 100 using the patterned dielectric hard mask layer 120'. Portions of the active layer 110 uncovered by the patterned dielectric hard mask layer 120' are etched until the tunneling oxide layer 103 is exposed, as shown in FIG. 1H. The etching process includes multiple etching steps for various materials of layers. The hard mask patterns 125 and the hard mask pattern 126 of the patterned dielectric hard mask layer 120' are transferred into the active layer 110 so that the active layer 110 forms gate stacks 115 in the memory cell predetermined area 50 and a gate stack 116 in the select transistor predetermined area 60, respectively. In some embodiments, additional features (such as source/drain regions) may be formed on the semiconductor memory structure 100 to produce a semiconductor memory device such as NAND-type flash memory.

The gate stacks 115 are used to form the memory cells of a flash memory device in that the first polysilicon layer 104 and the second polysilicon layer 105 are configured as the floating gates of the memory cells, the third polysilicon layer 107 and the fourth polysilicon layer 108 are configured as the control gates of the memory cells and also be served as the word lines. The gate stack 116 is used to form a select transistor.

The embodiments of the present disclosure utilize the supporting features 148 of the second core pattern 146 to enlarge the overlay window of the photolithography process for forming patterned photoresist layer 190. Therefore, the specification/control limit of the overlay of the photolithography process may be relaxed, which in turn saves the manufacturing cost and increases the production yield.

Figures 1, 2A:
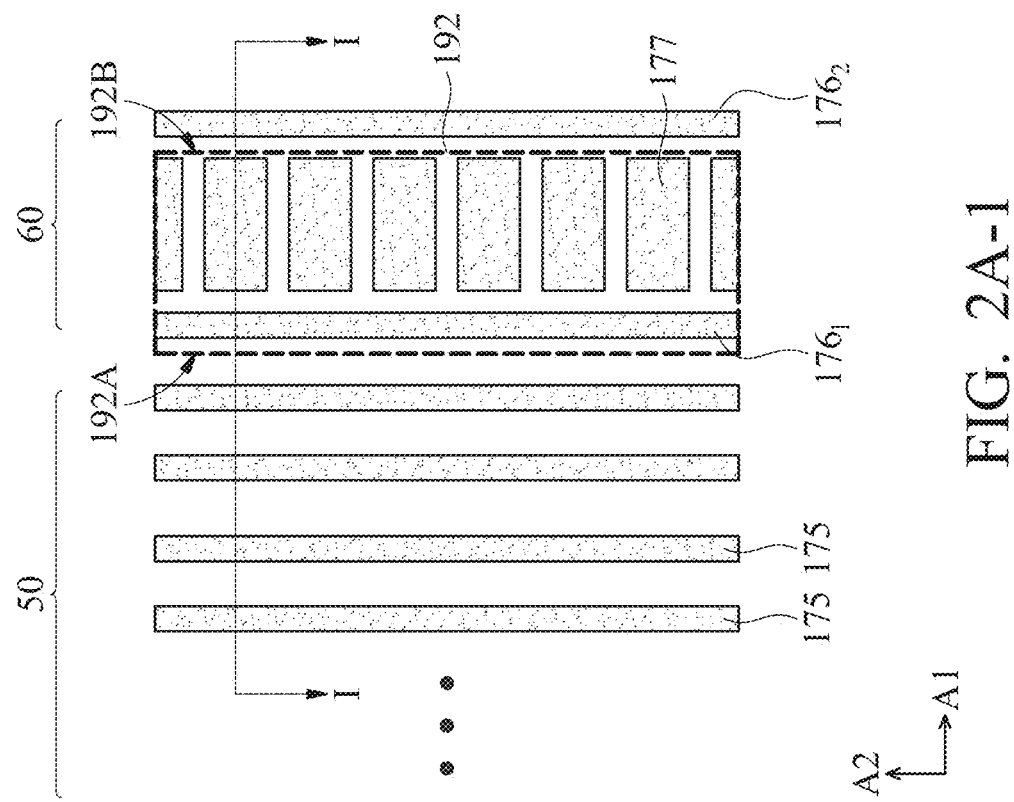
Figure 2A:
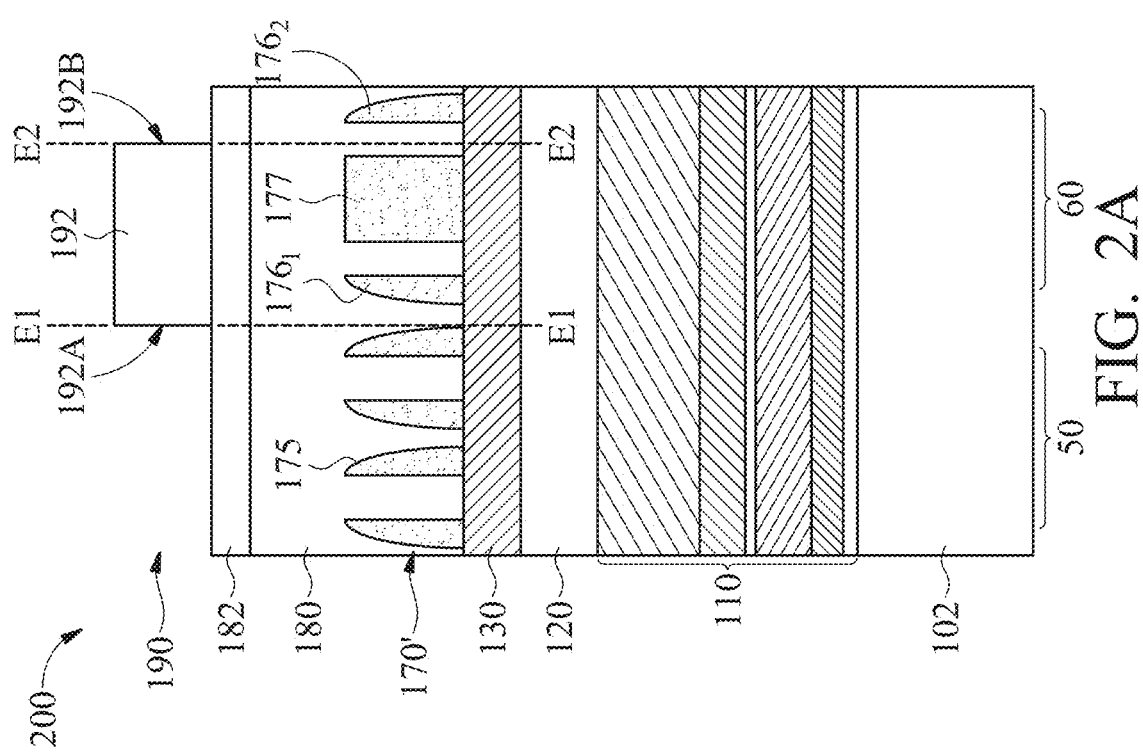

FIGS. 2A through 2C and FIG. 2A-1 illustrate schematic views of forming a semiconductor memory structure 200 at various stages in that FIG. 2A is a cross-sectional view taken along line I-I shown in a plan view of FIG. 2A-1, in accordance with some embodiments of the present disclosure. Elements or layers in FIGS. 2A through 2C and FIG. 2A-1 that are the same or similar to those in FIGS. 1A through 1I are denoted by like reference numerals that have the same meaning, and the description thereof will not be repeated for the sake of brevity. The semiconductor memory structure 200 of the FIGS. 2A through 2C is similar to the semiconductor memory structure 100 of the FIGS. 1A through 1I except for the misalignment of the photoresist pattern 192 with the second spacer $176_1/176_2$.

Continuing from FIG. 1E, a fill layer 180, an anti-reflective layer 182 and a patterned photoresist layer 190 are sequentially formed over the semiconductor memory structure 200, as shown in FIGS. 2A and 2A-1. The patterned photoresist layer 190 includes a photoresist pattern 192 disposed in the select transistor predetermined area 60. The photoresist pattern 192 covers the second spacer $176_1$ but does not cover the second spacer $176_2$. In some embodiments, the extending line E1-E1 of the sidewall 192A of the photoresist pattern 192 does not pass through the second spacer $176_1$. That is, in a plan view of FIG. 2A-1, a sidewall 192A of the photoresist pattern 192 is located outside the area of the second spacer $176_1$. In some embodiments, the extending line E2-E2 of another sidewall 192B of the photoresist pattern 192 does not pass through the second spacer $176_2$. That is, in a plan view of FIG. 2A-1, the sidewall 192B of the photoresist pattern 192 is located outside the area of the second spacer $176_2$.

The step as described above in FIG. 1G is performed on the semiconductor memory structure 200, thereby forming a patterned semiconductor hard mask layer 130', as shown in FIG. 2B. Because the photoresist pattern 192 does not cover the second spacer $176_2$, a notch 202 is formed at the upper surface of the hard mask pattern 136 between the fill layer 180' and the second spacer $176_2$. The strip $147_1$ and strip $147_2$ of the second core pattern 146 can be formed to have the narrower widths D5 by forming the supporting features 148 (FIG. 1B-1) of the second core pattern 146, thereby reducing the distance D9 between the second spacer $176_1/176_2$ and the third spacer 177 (FIG. 1E-1), in accordance with some embodiments. As such, the notch 202, formed at the upper surface of the hard mask pattern 136, may have a small size.

An etching process as described above in FIG. 1H is performed on the semiconductor memory structure 200, thereby forming a patterned dielectric hard mask layer 120', as shown in FIG. 2C. Because the notch 202 has a small size, the likelihood of the notch 202 extending into the mask pattern due to the etching process may be reduced. If the notch extends into the mask pattern of the dielectric hard mask layer, the subsequently formed select gate may suffer a pattern failure issue. Therefore, the specification/control limit of the overlay of the photolithography process may be relaxed, which in turn saves the manufacturing cost and increases the production yield.

Figure 3A:
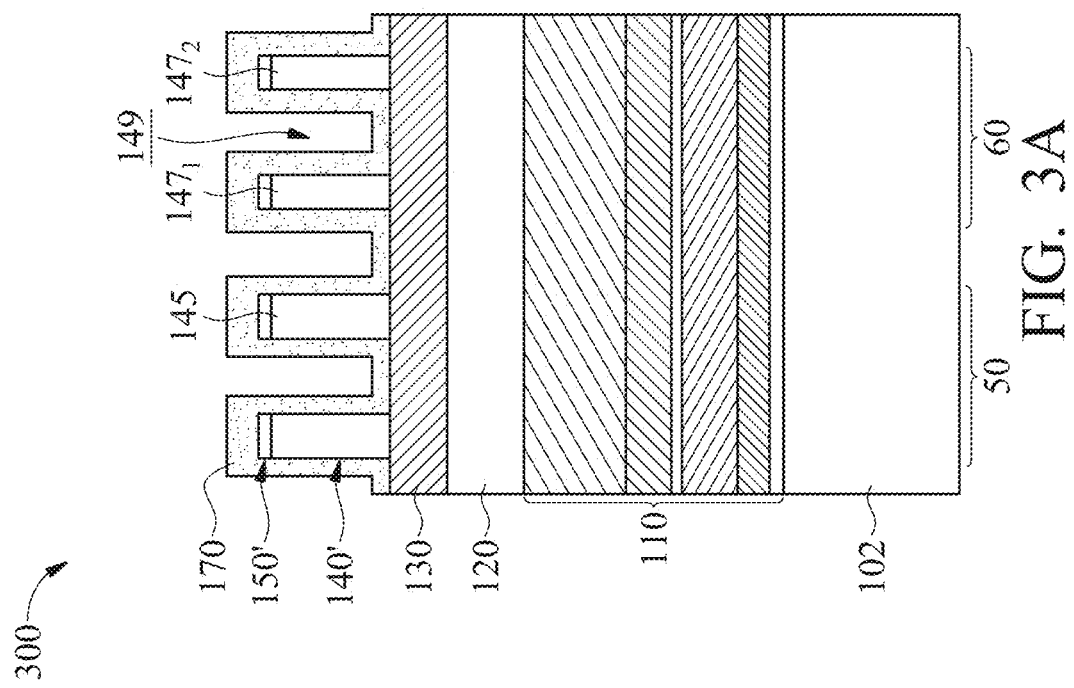
Figures 1, 3B:
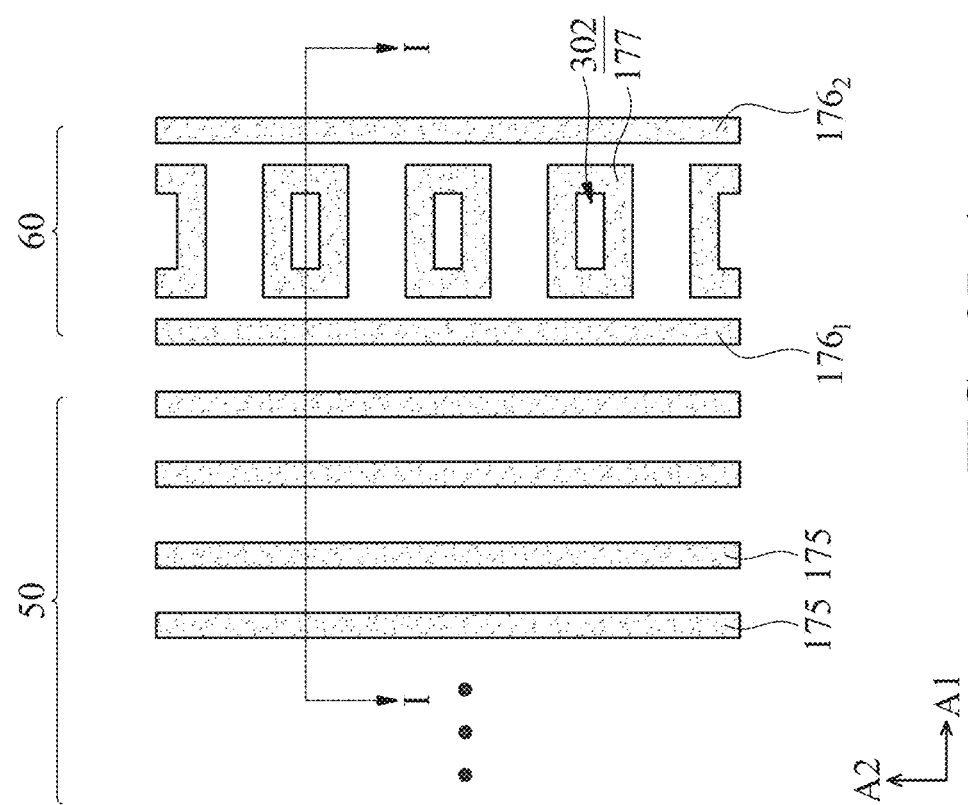
Figure 3B:
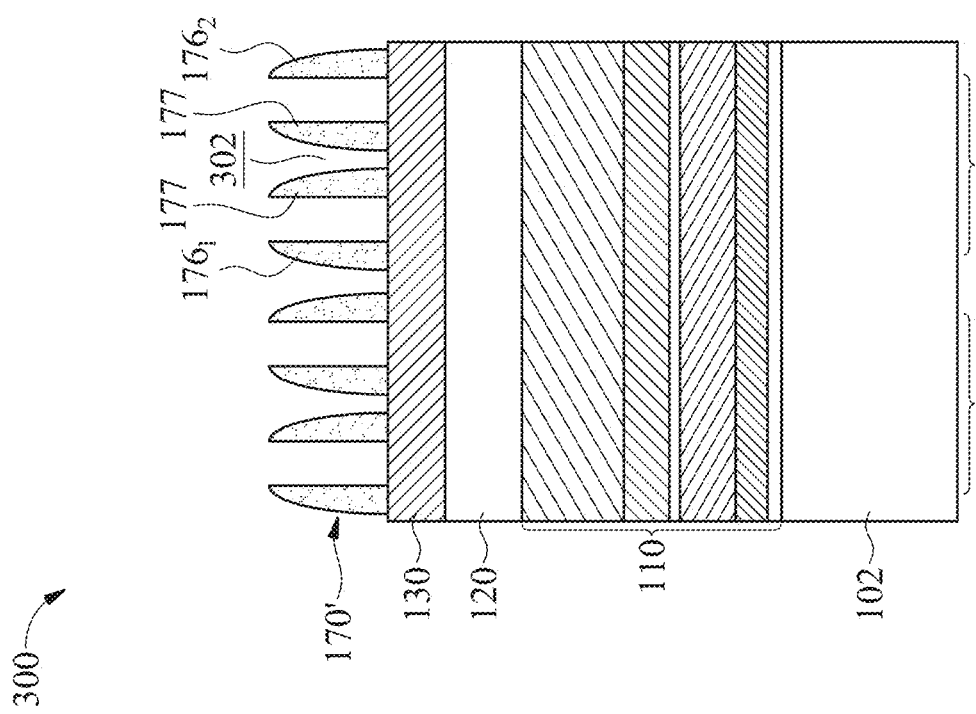

FIGS. 3A and 3B and FIG. 3B-1 illustrate schematic views of forming a semiconductor memory structure 300 at various stages in that FIG. 3B is a cross-sectional view taken along line I-I shown in a plan view of FIG. 3B-1, in accordance with some embodiments of the present disclosure. Elements or layers in FIGS. 3A and 3B that are the same or similar to those in FIGS. 1A through 1I are denoted by like reference numerals that have the same meaning, and the description thereof will not be repeated for the sake of brevity. The semiconductor memory structure 300 of the FIGS. 3A and 3B is similar to the semiconductor memory structure 100 of the FIGS. 1A through 1I except for the third spacer 177.

Continuing from FIG. 1B, a conformal layer 170 is formed over the semiconductor memory structure 300, as shown in FIG. 3A. The conformal layer 170 is formed along the sidewalls and the bottom surfaces of the openings 149 to partially fill the openings 149.

The steps as described above in FIGS. 1D and 1E are performed on the semiconductor memory structure 300, thereby forming a spacer layer 170' and removing the patterned core layer 140', as shown in FIGS. 3B and 3B-1. The spacer layer 170' includes second spacers $176_1$ and $176_2$ and a plurality of third spacers 177, in accordance with some embodiments. Because the portions of the conformal layer 170 formed along the bottom surfaces of the openings 149 is removed, the third spacers 177 have openings 302 exposing the semiconductor hard mask layer 130. As such, the third spacers 177 have a closed-loop profile, as shown in FIG. 3B-1.

Figures 1, 4A:
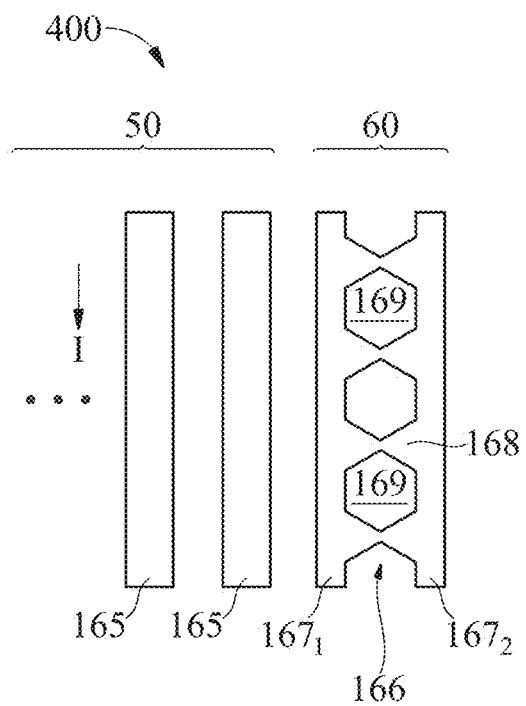
Figures 1, 4B:
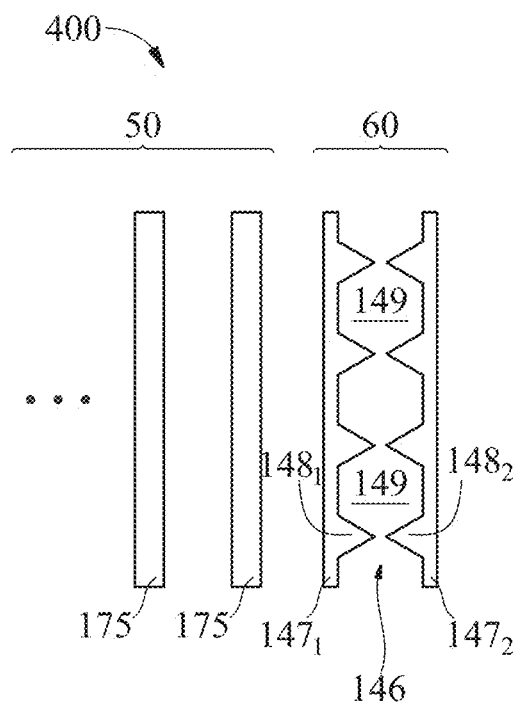
Figures 1, 4C:
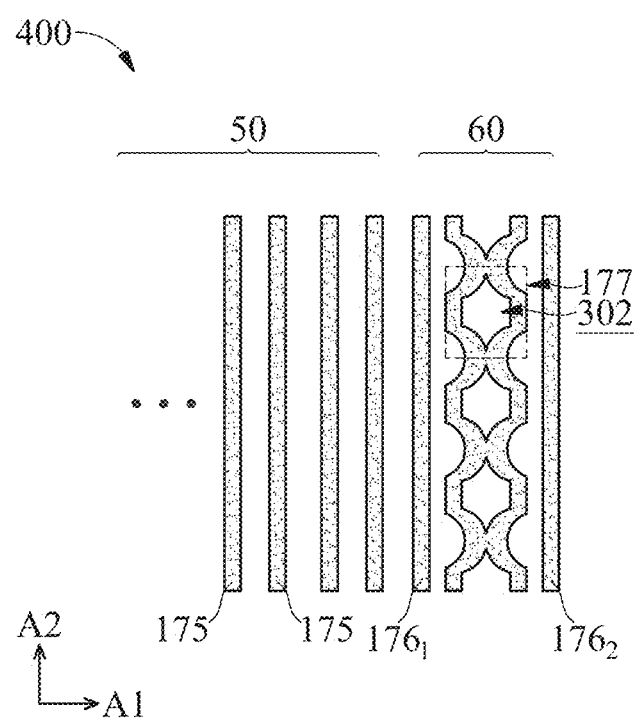

FIGS. 4A-1 through 4C-1 illustrate plan views of forming a semiconductor memory structure 400 at various stages, in accordance with some embodiments of the present disclosure. Elements or layers in FIGS. 4A-1 through 4C-1 that are the same or similar to those in FIGS. 1A through 1I are denoted by like reference numerals that have the same meaning, and the description thereof will not be repeated for the sake of brevity. The semiconductor memory structure 400 of the FIGS. 4A-1 through 4C-1 is similar to the semiconductor memory structure 100 of the FIGS. 1A through 1I except for the third spacer 177.

FIG. 4A-1 illustrates the first photoresist pattern 165 and the second photoresist pattern 166 of the patterned photoresist layer 160, in accordance with some embodiments. The widths of the connecting portions 168 of the second photoresist pattern 166 decrease gradually from the strip $167_1$ and $167_2$ toward the centers of the connecting portions 168 so that the openings 169 may have hexagon-like profiles.

The step described above in FIG. 1B is performed on the semiconductor memory structure 400, thereby forming a patterned core layer 140', as shown in FIG. 4B-1. After the trimming process, the supporting portions 148 of the patterned core layer 140' may be broken from the centers of the supporting portions 148, and thus form supporting portions $148_1$ and supporting portions $148_2$ which are separated from one another. The supporting portions $148_1$ abut the strip $147_1$ and the supporting portions $148_2$ abut the strip $147_2$. The openings 149 are in connection with each other.

The step described above in FIG. 3B is performed on the semiconductor memory structure 400, thereby forming a spacer layer 170' and removing the patterned core layer 140', as shown in FIG. 4C-1. The spacer layer 170' includes second spacers $176_1$ and a plurality of third spacers 177 partially filling the openings 149. The third spacers 177 are in connection with each other and each of the third spacers 177 has an opening 302 exposing the semiconductor hard mask layer 130.

As described above, the embodiments of the present disclosure utilize the supporting features of the second core pattern to enlarge the overlay window of the photolithography process for forming the select gate pattern. Therefore, the specification/control limit of the overlay of the photolithography process may be relaxed, which in turn saves the manufacturing cost and increases the production yield.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor memory structure, comprising:
   sequentially forming an active layer, a hard mask layer and a core layer over a substrate;
   etching the core layer to form a core pattern, wherein the core pattern comprises a first strip, a second strip, and a plurality of supporting features abutting the first strip and the second strip;
   forming a spacer layer alongside the core pattern, wherein forming the spacer layer comprises:
      forming a conform layer along the core pattern and filling a plurality of openings which are defined by the first strip, the second strip and the plurality of supporting features; and
      etching the conform layer;
   removing the core pattern;
   forming a photoresist pattern above the spacer layer;
   etching the hard mask layer using the photoresist pattern and the spacer layer to form a hard mask pattern; and
   transferring the hard mask pattern into the active layer to form a gate stack,
   wherein the plurality of supporting features extends in a first direction, and the first strip and the second strip extend in a second direction that is substantially perpendicular to the first direction.

2. The method for forming the semiconductor memory structure as claimed in claim 1, wherein the supporting features are arranged in the second direction.

3. The method for forming the semiconductor memory structure as claimed in claim 1, wherein the plurality of supporting features continuously extends from the first strip to the second strip.

4. The method for forming the semiconductor memory structure as claimed in claim 1, further comprising:
   performing a trimming process on the core pattern before forming the spacer layer so that the plurality of supporting features forms a plurality of first supporting portions abutting the first strip and a plurality of second supporting portions abutting the second strip, wherein the plurality of first supporting portions is separated from the plurality of second supporting portions.

5. The method for forming the semiconductor memory structure as claimed in claim 1, wherein the spacer layer comprises:
   a first spacer formed on a first side of the first strip;
   a second spacer formed on a second side of the second strip; and
   a plurality of third spacers filling the openings.

6. The method for forming the semiconductor memory structure as claimed in claim 5, wherein the third spacers are separated from one another.

7. The method for forming the semiconductor memory structure as claimed in claim 5, wherein in a plan view, at least one of the third spacers has a closed-loop profile.

8. The method for forming the semiconductor memory structure as claimed in claim 5, further comprising:
   performing a trimming process on the core pattern before forming the spacer layer so that the openings are in connection with one other, wherein the third spacers are in connection with one other.

9. The method for forming the semiconductor memory structure as claimed in claim 5, wherein an extending line of a first sidewall of the photoresist pattern passes through the first spacer, and an extending line of a second sidewall of the photoresist pattern passes through the second spacer.

10. The method for forming the semiconductor memory structure as claimed in claim 1, wherein the core pattern further comprises a third strip laterally spaced apart from the first strip, and the first strip is narrower than the third strip.

11. The method for forming the semiconductor memory structure as claimed in claim 1, wherein the semiconductor memory structure is a flash memory device and the gate stack is a select gate of the flash memory device.

12. A method for forming a semiconductor memory structure, comprising:
   sequentially forming an active layer, a hard mask layer and a core layer over a substrate;
   forming a first photoresist pattern and a second photoresist pattern over the core layer, wherein the second photoresist pattern comprises a first strip, a second strip, and a plurality of connecting features extending from the first strip to the second strip;
   transferring the first photoresist pattern and the second photoresist into the core pattern to form a first core pattern and a second core pattern respectively, wherein the second core pattern comprises a third strip, a fourth strip, and a plurality of supporting features extending from the third strip to the fourth strip;
   forming a pair of first spacers on opposite sides of the first core pattern and a pair of second spacers on opposite sides of the second core pattern, wherein forming the pair of first spacers and the pair of second spacers comprises:
   forming a conformal layer along the first and second core patterns to fill a plurality of openings which are defined by the third strip, the fourth trop and the plurality of supporting features;
   removing the first core pattern and the second core pattern;
   forming a third photoresist pattern over the pair of second spacers; and
   etching the hard mask layer and the active layer using the third photoresist pattern, the pair of first spacers, and the pair of second spacers.

13. The method for forming the semiconductor memory structure as claimed in claim 12, wherein a ratio of a width of the first strip of the second photoresist pattern to a width of the first photoresist pattern is from 0.8 to 1.0.

14. The method for forming the semiconductor memory structure as claimed in claim 12, wherein the third photoresist pattern covers one of the second spacers but do not cover another one of the second spacers.

15. The method for forming the semiconductor memory structure as claimed in claim 12, wherein the hard mask layer comprises a dielectric layer and a semiconductor layer over the dielectric layer, and etching the hard mask layer comprises:
   etching the semiconductor layer, wherein portions of the semiconductor layer covered by the pair of first spacers form first hard mask patterns, and a portion of the semiconductor layer covered by the third photoresist pattern and the pair of second spacers forms a second hard mask pattern; and
   etching the dielectric layer, wherein portions of the dielectric layer covered by the first hard mask patterns form third hard mask patterns, and a portion of the dielectric layer covered by the second hard mask pattern forms a fourth hard mask pattern.

16. The method for forming the semiconductor memory structure as claimed in claim 15, wherein the active region is etched so that portions of the active layer covered by the third hard mask patterns form first gate stacks, and a portion of the active layer covered by the fourth hard mask pattern forms a second gate stack.

17. The method for forming the semiconductor memory structure as claimed in claim 15, wherein the second hard mask pattern has a notch at an upper surface of the second hard mask pattern, and the notch does not extend into the dielectric layer after etching the dielectric layer.

18. The method for forming the semiconductor memory structure as claimed in claim 12, further comprising:
   forming a third spacer to fill a first opening in the second core pattern while forming the pair of first spacers and the pair of second spacers, wherein the third spacer has a second opening exposing the hard mask layer.

19. The method for forming the semiconductor memory structure as claimed in claim 18, wherein a first distance is between one of the second spacers and the third spacer, a second distance is between the first spacers, and a ratio of the first distance to the second distance is from 0.8 to 1.0.

* * * * *